United States Patent [19]

Canestaro et al.

[11] Patent Number: 4,554,184
[45] Date of Patent: Nov. 19, 1985

[54] METHOD FOR PLATING FROM AN ELECTROLESS PLATING BATH

[75] Inventors: Michael J. Canestaro, Endicott; Ronald A. Kaschak, Vestal; Donald G. McBride, Binghamton; Donald P. Seraphim, Vestal, all of N.Y.

[73] Assignee: International Business Machines Corporation, Armonk, N.Y.

[21] Appl. No.: 626,961

[22] Filed: Jul. 2, 1984

[51] Int. Cl.⁴ .............................................. C23C 3/02
[52] U.S. Cl. .................................... 427/345; 427/437; 427/438; 427/443.1
[58] Field of Search ............... 427/437, 438, 443.1, 427/345

[56] References Cited

U.S. PATENT DOCUMENTS 2,658,839  11/1953  Talmey ........................ 427/438
2,717,218   9/1955  Talmey .
2,819,188   1/1958  Metheny .
2,872,353   2/1959  Metheny .
2,872,354   2/1959  Lee ............................. 427/438
2,941,902   6/1960  Talmey ........................ 427/438
2,955,959  10/1960  Du Rose ...................... 427/438
4,152,467   5/1979  Alpaugh ..................... 427/443.1

Primary Examiner—John D. Smith
Attorney, Agent, or Firm—Pollock, Vande Sande & Priddy

[57] ABSTRACT

A method for plating a metal from an electroless plating bath onto a substrate is provided which includes providing a source of an electroless plating bath at a non-plating temperature in a master mixing tank; transferring at least a portion of the plating bath to at least one plating cell, changing the bath temperature to a plating temperature, and contacting the substrate to be plated with the bath at a plating temperature.

19 Claims, 1 Drawing Figure

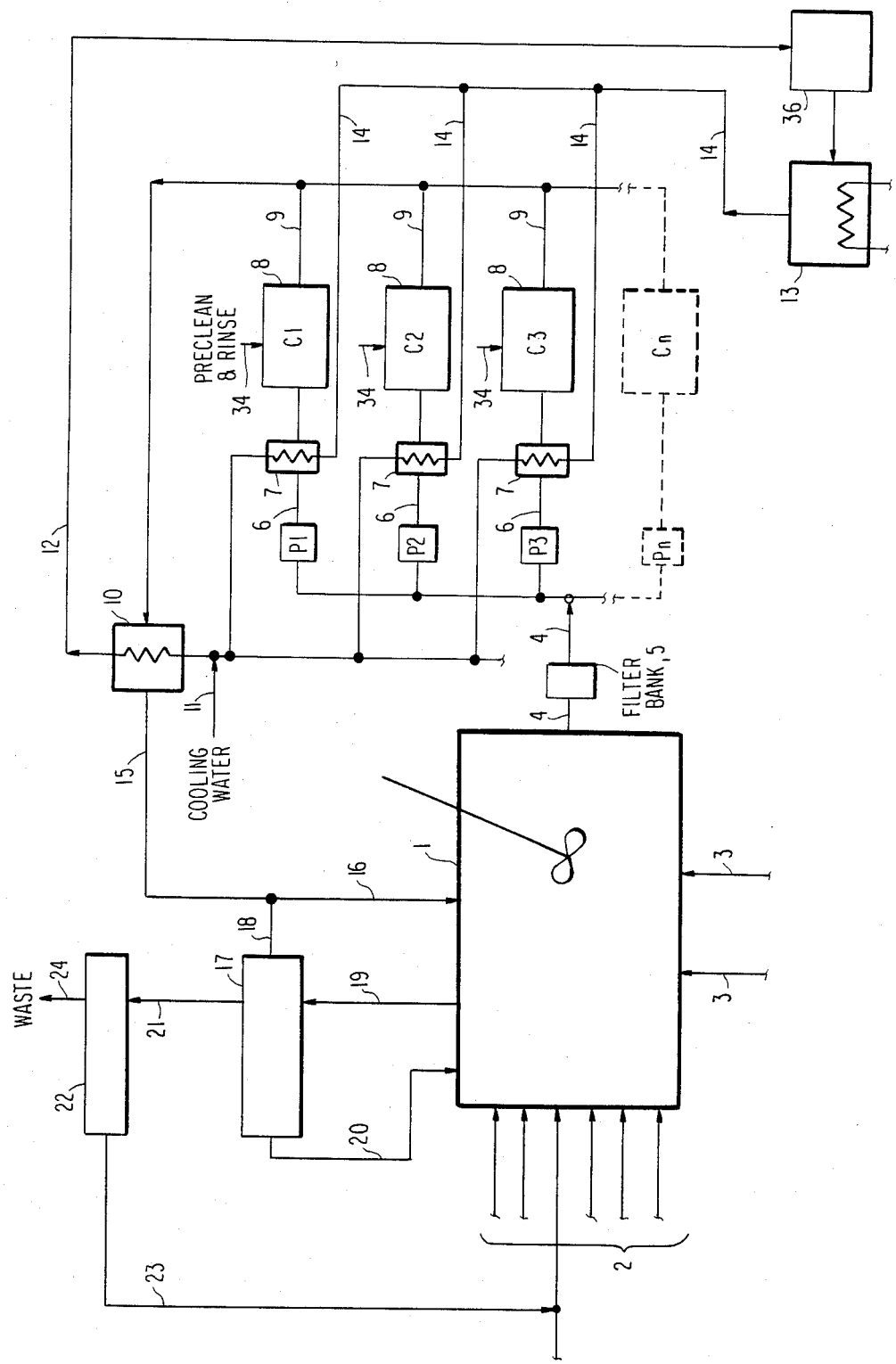

METHOD FOR PLATING FROM AN ELECTROLESS PLATING BATH

DESCRIPTION

1. Technical Field

The present invention is concerned with a method depositing a metal onto a substrate from an electroless plating bath. The present invention is especially applicable for depositing copper, nickel, and/or gold onto a desired substrate. The present invention provides a process for insuring against large changes in the relative amounts of the constituents of the plating bath. In addition, the present invention makes it possible to substantially reduce the occurrence of nodule formation.

2. Background of Invention

The electroless plating of various metals, such as copper and nickel, onto a substrate is well-known in the art. For instance, an electroless or autocatalytic copper plating bath usually contains a cupric salt, a reducing agent for the cupric salt, a chelating or complexing agent, and a pH adjustor. In addition, if the surface being plated is not already catalytic for the deposition of the desired metal, a suitable catalyst is deposited on the surface prior to contact with the plating bath. Among the more widely employed procedures for catalyzing a substance is the use of stannous chloride sensitizing solution and a palladium chloride activator to form a layer of metallic palladium particles.

Although the technology relative to the electroless copper plating is continually being improved, there still remains room for additional improvement. Certain problems are especially pronounced when preparing articles of very high quality, such as those to be employed in printed circuit applications, e.g.—printed circuit boards which contain high-density circuits and large numbers of holes, such as through-holes and blind holes.

A major reason for yield loss in electroless plating is the formation of what is known as extraneous copper or nodules. The formation of nodules in unwanted areas on a substrate can result in short-circuiting by bridging circuit lines on the substrate. In addition, such processes as applying protective coatings and solder, as well as pin insertion in the through holes are adversely affected by the presence of nodules on the surface.

Another problem encountered is the formation of voids on the surface and on the metallization located in the holes. This, in turn, can cause unreliable electrical connections. Moreover, even if the electrical connections initially are adequate, the presence of voids tends to cause the coatings to crack during use of the circuits. During operation, integrated circuit boards tend to expand and contract somewhat. Any discontinuities in the metallization represent a prime site for cracking due to the mechanical stress from such expansion and contraction.

Although many of the problems of void formation and nodule formation can be minimized by the judicious selection of the bath constituents and the conditions of plating, relatively small changes in constituents which invariably occur from time to time can result in the occurrence of nodules and/or voids and/or failure to plate at all. This, in turn, results in discarding potential parts and loss of yield.

SUMMARY OF INVENTION

The present invention provides a method for significantly reducing, if not entirely eliminating, the formation of nodules during plating from an electroless plating bath. In addition, the present invention provides for a method whereby undesired drastic or large changes in the concentration of the constituents of the plating bath can be prevented. Another advantageous aspect of the present invention is the possibility of employing increased flow rates of the plating bath relative to the surfaces being plated which, in turn, results in reduction of plating voids and increased plating rates.

The present invention is concerned with a method for plating a metal onto a substrate from an electroless plating solution. The method includes providing a source of an electroless plating bath which is maintained at a non-plating temperature in a master mixing tank. At least a portion of the plating bath is conveyed or transferred from the master mixing tank to at least one plating cell containing the substrate to be plated. The amount of plating bath transferred to any one plating cell is less than the total of the plating bath in the master mixing tank. The temperature of the plating bath is changed from a non-plating to a plating temperature while, at the same time, maintaining the concentration of constituents, except for the gases in the plating bath, substantially constant. The substrate to be plated is contacted with the plating bath at the plating temperature in the plating cell.

BRIEF DESCRIPTION OF DRAWING

The FIGURE is a schematic diagram of an arrangement suitable for carrying out the process of the present invention.

BEST AND VARIOUS MODES FOR CARRYING OUT INVENTION

According to the present invention, an advantageous plating system is provided whereby an electroless bath is maintained at a non-plating temperature in a master mixing tank. When plating onto a substrate is desired, the electroless plating bath is conveyed to a plating cell and the temperature of the bath is changed to temperature capable of plating. To facilitate understanding of the present invention, reference is made to FIG. 1. In particular, the various constituents of the plating bath are incorporated into the master mixing tank 1 via conduits 2. The composition is maintained in the master mixing tank 1 at a temperature at which the composition is not capable of plating. For instance, with respect to the preferred aspects of the present invention, the bath is maintained at a sub-plating temperature. Moreover, with respect to the preferred copper electroless plating baths employed in accordance with the present invention, the temperature in the master mixing tank is maintained at a sub-plating temperature of about 25° C. to about 65° C.

The plating bath is well agitated in the master mixing tank by mechanical agitation such as propellers and baffles. The constituents of the bath are well agitated in order to assure against concentration gradients in any one portion of the bath.

Examples of suitable metals which can be plated according to the present invention include copper, nickel, and gold. If desired, mixtures of these metals can be plated. The preferred metal is copper.

The preferred copper electroless plating baths are disclosed in U.S. Pat. Nos. 3,844,799 and 4,152,467, disclosures of which are incorporated herein by reference.

The copper electroless plating bath is generally an aqueous composition which includes a source of cupric ion, a reducing agent, a complexing agent for the cupric ion, and a pH adjustor. The plating baths also preferably include a cyanide ion source and a surface-active agent.

The cupric ion source generally uses a cupric sulfate or a cupric salt of the complexing agent to be employed.

When employing cupric sulfate, it is preferred to use amounts from about 3 to about 15 gram/liter and most preferably about 8 to about 12 gram/liter.

The most common reducing agent employed is formaldehyde which, in the preferred aspects of the present invention, is used in amounts from about 0.7 to about 7 gram/liter and most preferably from about 0.7 to about 2.2 gram/liter.

Examples of some other reducing agents include formaldehyde precursors or derivatives such as paraformaldehyde, trioxane, dimethylhydantoin, and glyoxal; borohydrides such as alkali metal borohydrides (sodium and potassium borohydride) and substituted borohydrides such as sodium trimethoxy borohydrides; and boranes such as amine borane (isopropyl amine borane and morpholine borane).

Examples of some complexing agents include Rochelle salts, ethylene diamine tetraacetic acid, the sodium (mono-, di-, tri-, and tetra- sodium) salts of ethylene diamine tetraacetic acid, nitrolotetraacetic acid and its alkali salts, gluconic acid, gluconates, triethanol amine, glucono (gamma)-lactone, modified ethylene diamine acetates such as N-hydroxyethyl ethylene diamine triacetate. Moreover, a number of other cupric complexing agents are suggested in U.S. Pat. Nos. 2,996,408; 3,075,856; 3,075,855; and 2,938,805. The amount of complexing agent is dependent upon the amount of cupric ions present in the solution and is generally from about 20 to about 50 gram/liter.

The plating bath can also include a surfactant which assists in wetting the surface to be coated. A satisfactory surfactant is, for instance, an organic phosphate ester, available under the trade designation "Gafac RE-610". Generally, the surfactant is present in amounts from about 0.02 to about 0.3 gram/liter.

In addition, the pH of the bath is generally controlled, for instance, by the addition of a basic compound such as sodium hydroxide or potassium hydroxide in the desired amount to achieve the desired pH. The preferred pH of the electroless plating bath is between 11.6 and 11.8.

Also, preferably, the plating bath contains a cyanide ion and most preferably, contains about 10 to about 25 milligrams/liter to provide a cyanide ion concentration in the bath within the range of 0.0002 to 0.0004 molar. Examples of some cyanides which can be employed are the alkali metal, alkaline earth metal, and ammonium cyanides. In addition, the plating bath can include other minor additives as is known in the art.

The preferred plating baths employed have a specific gravity within the range of 1.06 to 1.08. Moreover, during plating, the temperature of the plating bath is preferably maintained between about 70° C. and about 80° C. and most preferably, between about 70° C. and about 75° C. For a discussion of the preferred plating temperature coupled with the preferred cyanide ion concentrations, see U.S. Pat. No. 3,844,799.

Also, the $O_2$ content of the bath can be maintained between 2 ppm and 4 ppm and preferably, about 2.5 to about 3.5 ppm during plating, as discussed in U.S. Pat. No. 4,152,467. The $O_2$ content can be controlled by injecting oxygen and an inert gas such as nitrogen into the bath. The overall flow rate of the gases into the bath is generally from about 1 to about 20 SCFM per thousand gallons of bath and preferably, from about 3 to about 8 SCFM per thousand gallons of bath. The gases can be injected into the bath via the bottom of the mixing tank from conduits 3.

The various constituents of the bath can be conveyed to the master mixing tank in the proper relative amounts by use of electronic controllers (not shown). In addition, since the master mixing tank is significantly larger than any of the individual plating cells, the bath itself acts as a chemical sink preventing additions of chemicals which would significantly alter the relative concentrations of ingredients. In particular, because of the relative size of the master mixing tank, any minor variations in amounts of materials or additional chemicals that may be introduced as impurities is significantly minimized and diluted.

Nodule or extraneous copper formation is significantly reduced, if not entirely eliminated, since the bath in the master mixing tank is not capable of plating but, instead, is preferably at a temperature capable of deplating or of etching. First of all, formation of nodule (e.g.—$Cu_2O$ or $CuOH$ nuclei) that can form due to small concentration gradients at the chemical feedpoints will be minimized due to good chemical mixing which can be achieved in the master mixing tank. Moreover, since the bath is in a non-plating mode and preferably in a deplating mode, any nodules that may form will not grow in size due to plating of the nuclei as can occur when the plating bath is at plating temperature.

Another advantage attributable to the use of the master mixing tank, as employed in accordance with the present invention, is that dummy panels which are now currently used in manufacturing in order to attempt to compensate for large changes in chemical compositions when panels are loaded into a larger bath for plating, will no longer be necessary. The control will be done in the main mixing tank, rather than at the site of the actual plating operation. This is advantageous since the use of dummy panels is not always sufficient to provide the time needed to respond to a large chemical concentration change. In view of the mixing of the constituents of the bath in the master mixing tank, large local chemical changes are avoided and the need to respond to such changes is eliminated. In preferred aspects of the present invention, the amount of plating bath in the master mixing tank is at least about 5 times and usually about 5 to about 40 times the amount of the bath in any one individual plating cell and preferably, is at least 10 times and most preferably about 10 to about 20 times the amount of plating bath in any one individual plating cell.

The plating bath is conveyed out of master mixing tank 1 via conduit 4 by pumps P1, P2, P3, . . . $P_n$. In a preferred aspect of the present invention, sub-micron filters, represented by filter bank 5, is placed before the pumps in order to remove sub-micron undissolved particles from the plating bath. Such a procedure is not possible when the plating bath is at plating temperature in view of the propensity of the bath to form at least some nodules which would tend to clog up the sub-micron filtering system. However, because the bath is at a temperature below plating temperature, the nodules will not form and thereby, sub-micron filtration can be employed. If desired, instead of a bank of filters 5 before the pumps, individual or separate filters can be provided after each pump. Portions of the plating bath are pumped through any one individual pump via conduit 6 to a heat exchanger 7 in order to change the temperature of the plating bath to that capable of plating such as in the preferred case raising it to about 70° C. to about 80° C. and preferably about 70° C. to about 75° C. for the preferred copper plating compositions employed in accordance with the present invention. It is preferred that the temperature be changed to the plating temperature prior to entry of the bath into the individual plating cells 8 (e.g.—$C_1$, $C_2$, $C_3$ . . . $C_n$). However, if desired, but less preferred, the plating bath can be changed within plating cells 8 to a temperature capable of plating, rather than being changed prior to entering therein to the desired temperature. The flow rate of the plating bath through the cells 8 can be regulated as desired and employing relatively high flow rates such as at about 50 gallons per minute to about 800 gallons per minute, and preferably about 350 gallons per minute to about 700 gallons per minute advantageously tends to reduce the possibility of plating voids. These flow rates are based on cells typically about 50 to about 500 gallons and more usually about 100 to about 300 gallons. In present practice, the panels or substrates being plated are actually mechanically agitated, which tends to cause some deterioration in the panels at the higher agitation speeds. However, in the setup of the present invention, it is the plating solution which provides the relative movement between the panels being plated and the plating bath.

The relative amounts of the constituents, except for dissolved gases of the bath in the plating cells, are substantially the same as those in the main mixing tank. Dissolved gases may differ since the temperature of the bath changes and therefore the amount of dissolved gases will inherently change. For instance, the solubility of oxygen in the plating bath decreases as the temperature increases. Accordingly, when an amount of gas and the temperature of the bath for the plating cell is determined, the amount of gas to be incorporated in the bath in the mixing tank can be readily determined by the relative solubilities of the gas or gases at the different temperatures involved. Also, if desired, the oxygen content of the bath in the individual plating cells can be controlled by injecting gases, and especially inert gases such as nitrogen, into the individual plating cells to displace oxygen in the bath.

The plating bath is removed from the plating cell after plating via conduits 9 and can be conveyed to heat exchanger 10 for cooling the temperature of the bath back down to temperature below that capable of plating such as at about 25° C. to about 40° C. The heat exchanger can employ cooling water in conduit 11 at a temperature of about 20° C. The cooling water employed can be the exit water from the heat exchanger 7 that is used to heat up the plating bath to plating temperature. The cooling water can be conveyed from heat exchanger 10 via conduit 12 to holding tank 36 and then to heater 13 to raise the temperature thereof to about 80° C. and then returned via conduit 14 to heat exchangers 7. As can be appreciated, the energy required to heat and cool the bath before and after the plating cells will be relatively small for the following reasons:

1. The plating itself is neither endothermic nor exothermic.
2. The volume of the bath to be maintained at the plating temperature is relatively small compared to the total volume of the bath in the master mixing tank.
3. The bath leaving the plating cells at the elevated temperature can be employed to preheat the cooling water at the heat exchanger 10 prior to returning the cooling water to the heating system and heater 13.

In addition, the plating cells 8 include means, such as conduits 34, to provide means for conveying cleaning and rinsing materials for precleaning the substrates to be coated prior to the plating operation. In addition, this precleaning can be carried out under a inert gas atmosphere such as a nitrogen atmosphere in order to minimize oxidation.

With respect to the surfaces upon which the copper is plated, they must be catalytic for the deposition of copper. In the event the surface being plated is not already catalytic for the deposition of copper, a suitable catalyst is deposited onto the surface prior to contact with the plating bath. Among the more widely employed procedures for catalyzing a substrate is the use of a stannous chloride sensitizing solution and a palladium chloride activator to form a layer of metallic palladium particles. One such surface is an epoxy-fiberglass laminate containing already deposited copper in those areas where copper is to be plated and/or being seeded with a stannous chloride and palladium chloride activating sytem.

After the plating, the plated substrates can be rinsed and dried in the plating cells prior to removal therefrom.

In addition, after completion of the plating cycle and removal of the plated substrates therefrom, the plating bath can be conveyed to the cells at temperature below the plating temperature, rather than being heated to the plating temperature in order to etch the plating cell walls and piping in conduits leading from the master mixing tank to the plating cells prior to loading subsequent basket of plating substrates into the plating cell. This use of the plating baths in an etching mode eliminates the need for separate etching operations to clean the plating cells. This also eliminates the need for shut down of the plating cells for etching and use of separate etching compositions.

The used plating bath is conveyed from heat exchanger 10 via conduit 15 either to the master mixing tank 1 via conduit 16 and/or to an electrolytic copper recovery tank 17 via conduit 18. The used bath at the temperatures below plating can be used to remove or dissolve copper which has electrically been plated out of any overflow via conduit 19 from the master mixing tank and then returned to the master mixing tank via conduit 20. After electrolytic copper removal, the used bath is conveyed via conduit 21 to a container 22 for recovery of complexing agent as is known and the complexing agent recovered can then be conveyed via conduit 23 to conduit 2 and back into the master mixing tank 1. Waste composition is then removed from complexing recovery unit 22 via conduit 24.

What is claimed is:

1. A process for plating copper metal from an electroless copper plating bath on a substrate wherein the formation of nodules during plating is at least significantly reduced which comprises:
   (A) providing a source of an electroless plating bath maintained at a non-plating temperature in a master mixing tank;

(B) transferring at least a portion of the plating bath to at least one plating cell wherein the amount of plating bath transferred to any one plating cell is less than the total of plating bath in said master mixing tank;

(C) changing the temperature of said bath from a non-plating temperature to a plating temperature, while maintaining substantially constant the concentration of components except for dissolved gases in said bath; and (D) contacting a substrate to be plated with the bath at a plating temperature in the plating cell.

2. The process of claim 1 wherein the plating bath is intermittently transferred to said at least one plating cell at a deplating temperature.

3. The process of claim 1 wherein said non-plating temperature is a sub-plating temperature.

4. The process of claim 1 wherein said non-plating temperature is a deplating temperature of about 25° C. to about 40° C.

5. The process of claim 4 wherein said plating temperature is about 70° C. to about 80° C.

6. The process of claim 4 wherein said plating temperature is about 70° C. to about 75° C.

7. The process of claim 1 wherein the amount of plating bath in said master mixing tank is at least 5 times the amount of plating bath in any one individual plating cell.

8. The process of claim 1 wherein the amount of plating bath in the master mixing tank is at least 10 times the amount of plating bath in any one individual plating cell.

9. The process of claim 1 which further includes filtering the plating bath through sub-micron filters prior to conveying the bath to the plating cell.

10. The process of claim 1 wherein the temperature is changed to the plating temperature prior to the bath entering the plating cell.

11. The process of claim 1 wherein used plating bath is removed from said at least one plating cell and is transferred back to the master mixing tank, and the temperature of the plating bath is changed to a non-plating temperature during the transferring back to the master mixing tank.

12. The process of claim 1 being a continuous process.

13. The process of claim 1 wherein the flow rate of said plating bath in said plating cell is about 50 gallons per minute to about 800 gallons per minute based on a cell of about 50 to about 500 gallons.

14. The process of claim 1 wherein the flow rate of said plating bath in said plating cell is about 350 gallons per minute to about 700 gallons per minute based on a cell of about 100 to about 300 gallons.

15. The process of claim 1 wherein the amount of plating bath in said master mixing tank is about 10 to about 20 times the amount of plating bath in any one individual plating cell.

16. The process of claim 1 wherein said plating bath comprises about 3 to about 15 grams/liter of cupric ion source calculated as cupric sulfate; about 0.7 to about 7 grams/liter of formaldehyde; and about 20 to about 50 grams/liter of complexing agent.

17. The process of claim 16 wherein the pH of said plating bath is between 11.6 and 11.8.

18. The process of claim 1 wherein said non-plating temperature is a deplating temperature of about 25° C. to about 40° C.; said plating temperature is about 70° C. to about 75° C.; the amount of plating bath in said master mixing tank is at least 5 times the amount of plating bath in any one individual plating cell; the flow rate of said plating bath in said plating cell is about 50 gallons per minute to about 800 gallons per minute based on a cell of about 50 to about 500 gallons; said plating bath comprises about 3 to about 15 grams/liter of cupric ion source calculated as cupric sulfate; about 0.7 to about 7 grams/liter of formaldehyde; and about 20 to about 50 grams/liter of complexing agent; and wherein the pH of said plating bath is between 11.6 and 11.8.

19. The process of claim 18 wherein the flow rate of said plating bath in said plating cell is about 350 gallons per minute based on a cell of about 100 to about 300 gallons.

* * * * *